(12) United States Patent
Nagayama

(10) Patent No.: US 7,646,148 B2
(45) Date of Patent: Jan. 12, 2010

(54) ORGANIC EL DEVICE ARRAY

(75) Inventor: Kohei Nagayama, Kawasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 494 days.

(21) Appl. No.: 11/625,917

(22) Filed: Jan. 23, 2007

(65) Prior Publication Data

US 2007/0182322 A1 Aug. 9, 2007

(30) Foreign Application Priority Data

Feb. 8, 2006 (JP) ............... 2006-031045

(51) Int. Cl.
*H01L 51/50* (2006.01)
*H01L 51/52* (2006.01)

(52) U.S. Cl. .................. 313/512; 313/504; 313/506

(58) Field of Classification Search .......... 313/500–512
See application file for complete search history.

(56) References Cited

U.S. PATENT DOCUMENTS

2002/0180371 A1* 12/2002 Yamazaki et al. ........ 315/169.3
2004/0079941 A1   4/2004 Yamazaki et al. ............ 257/40
2007/0046191 A1* 3/2007 Saito ......................... 313/506

FOREIGN PATENT DOCUMENTS

JP   2002-270366    9/2002
KR   2004-0071438   8/2004

OTHER PUBLICATIONS

Korean Office Action, published Dec. 21, 2007.

* cited by examiner

*Primary Examiner*—Mariceli Santiago
(74) *Attorney, Agent, or Firm*—Fitzpatrick, Cella, Harper & Scinto

(57) ABSTRACT

An organic EL device array in which water or oxygen hardly enters a light emitting region, and high-quality light emission can be maintained for a longer period of time. The organic EL device array includes: a light emitting region (region I) having a plurality of organic EL light emitting portions for emitting light in an organic compound layer disposed between a pair of electrodes; a protective layer in contact with an upper electrode of the pair of electrodes; a member disposed on the protective layer; an intermediate layer disposed between the protective layer and the member, in which a thinner portion of the intermediate layer is present outside a light emitting region (region O) within the surface thereof.

2 Claims, 4 Drawing Sheets

ORGANIC EL DEVICE ARRAY

BACKGROUND OF THE INVENTION

1. Field of the Invention

The present invention relates to an organic EL (electroluminescence) device array, a display device including an organic EL device array in a display part thereof, and an image pickup apparatus.

2. Description of the Related Art

In recent years, an organic EL device serving as a self-emitting device has been noticed as a flat panel display. A structure of the organic EL device is a sandwich structure in which an organic light emitting layer is sandwiched between two electrodes on a glass substrate.

There is a well-known problem in that the organic EL device is generally extremely susceptible to water. There arises a problem in that when water enters the organic light emitting layer, a non-light emitting region called a dark spot is generated, thereby making it difficult to maintain light emission.

Japanese Patent Application Laid-Open No. 2002-270366 discloses a display device which is devised to prevent water from entering the organic light emitting layer.

FIG. 6 shows the display device disclosed in Japanese Patent Application Laid-Open No. 2002-270366. In the display device shown in FIG. 6, a display region 10 is sealed in a sealing resin 13. Between a substrate 1 and a sealing resin 14, the sealing resin 13 is entirely filled so as to cover the display region 10. A getter agent layer 21 is provided over the whole periphery of the sealing resin 13 so as to cover circumferential exposed portions of the sealing resin 13, and a sealing layer 23 is provided so as to cover the getter agent layer 21.

However, in general, the sealing resin is much more likely to allow permeation of water, oxygen, or the like than inorganic materials, so once the water, oxygen, or the like permeates through the sealing layer and the getter agent layer, the water, oxygen, or the like further permeates through the sealing resin to reach an organic thin film, which adversely blocks emission of light. In general, the sealing layer or the like is made of a material having a function of blocking off water, oxygen, or the like, but the permeation of the water, oxygen, or the like may gradually occur with the elapse of time. In addition, the permeation may occur through a defect or the like that has developed in the protective layer, so there is a demand for a structure which hardly allows water, oxygen, or the like to enter the organic thin film.

SUMMARY OF THE INVENTION

Therefore, the present invention provides an organic EL device array in which water, oxygen, or the like hardly enters a light emitting region having a plurality of organic EL light emitting parts, and high-quality light emission can be maintained for a longer period of time.

According to the present invention, there is provided an organic EL device array, which includes, within a surface thereof, a light emitting region having a plurality of organic EL light emitting portions for emitting light in an organic compound layer disposed between a pair of electrodes, including: a protective layer in contact with an upper electrode of the pair of electrodes; a member disposed on the protective layer; and an intermediate layer disposed between the protective layer and the member, in which a thinnest portion of the intermediate layer is present outside the light emitting region within the surface of the organic EL device array.

According to the present invention, the thinnest portion of the intermediate layer is present outside the light emitting region within the surface of the organic EL device array. According to the present invention, it is possible to narrow a passage through which water or the like enters. As a result, the water or the like hardly enters the light emitting region, thereby making it possible to prolong a life of the organic EL device array.

Features of the present invention will become apparent from the following description of exemplary embodiments with reference to the attached drawings.

DESCRIPTION OF THE EMBODIMENTS

Figure 1:
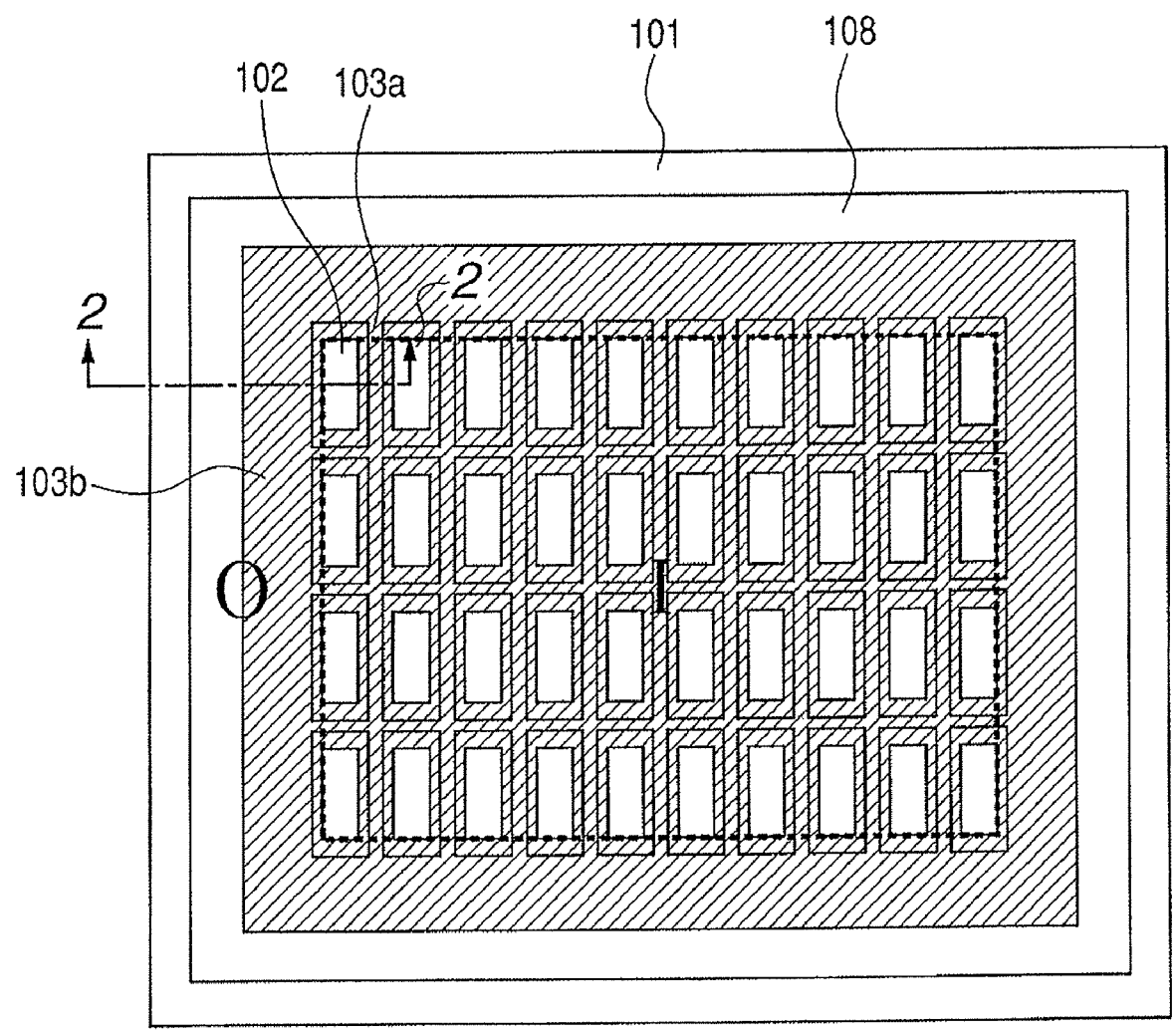
FIG. 1 is a schematic plan view of an organic EL device array according to the present invention.

An organic EL device array according to the present invention includes: a light emitting region having a plurality of organic EL light emitting portions for emitting light in an organic compound layer disposed between a pair of electrodes; a protective layer in contact with an upper electrode of the pair of electrodes; a member disposed on the protective layer; and an intermediate layer disposed between the protective layer and the member. In addition, a thinnest portion of the intermediate layer is present outside the light emitting region within the surface of the organic EL device array.

The thickness of the intermediate layer is made thinnest outside the light emitting region, thereby making it possible to obtain a structure in which water or the like hardly enters the light emitting region.

The protective layer and the member disposed thereon are formed of a material which hardly allows permeation of water or the like in general, but the intermediate layer is formed of a material, for example, a resin material which easily allows permeation of water or the like. Thus, the water which has entered from an outside permeates the entire organic EL device array through the intermediate layer.

The pair of electrodes and the organic compound layer disposed therebetween are covered with the protective layer, so water contained in the intermediate layer is blocked off by the protective layer, thereby making it difficult for the water to reach the organic compound layer. However, there may occur gradual permeation of water with the elapse of time. The permeation may occur through the defect or the like that has developed in the protective layer to reach the organic compound layer. The water or the like which reaches the organic compound layer due to those causes damages the organic compound layer, which becomes the cause of blocking the light emission.

According to the present invention, the thinnest portion of the intermediate layer is present outside the light emitting region within the surface, thereby making it possible to reduce the permeation of the water or the like which has entered the intermediate layer to reach the light emitting region. This is because the thinnest portion of the intermediate layer dominantly affects the permeation of the water, even though the thin intermediate layer is also preferable in the light emitting region. Thus, high-quality light emission can be maintained for a longer period of time.

The organic EL device array according to the present invention can be preferably used for a telereceiver, a monitor of a PC, and a display part of a cellular phone or the like. The display device including the organic EL device array of the present invention in the display part thereof can display a high-quality image for a longer period of time.

Further, the organic EL device array according to the present invention can also be preferably used for a projection imaging system such as a digital camera. The projection imaging system including the organic EL device array according to the present invention can display a high-quality image for a longer period of time.

Hereinafter, the organic EL device array according to the present invention will be described in detail with reference to the drawings.

First Embodiment

FIG. 1 is a schematic plan view of an organic EL device array according to the present invention. The organic EL device array includes a substrate 101, lower electrodes 102, insulating films 103a and 103b, and a member 108 disposed on a protective layer 106.

Figure 2:
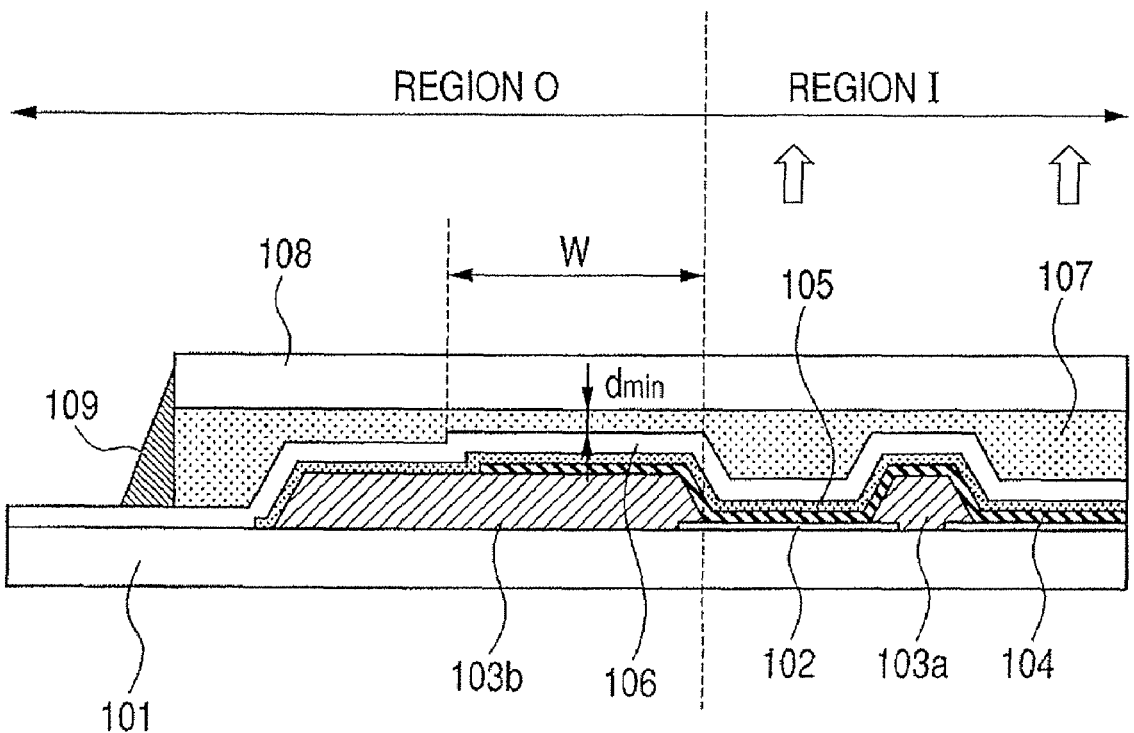
FIG. 2 is a cross-sectional schematic view of a structure taken along the line 2-2 of FIG. 1 of an organic EL device array according to a first embodiment of the present invention.

FIG. 2 is a cross-sectional schematic view of a structure taken along the line 2-2 of FIG. 1 of the organic EL device array according to a first embodiment of the present invention. Components of FIG. 2 identical with those of FIG. 1 are denoted by the same reference symbols. The other components include an organic compound layer 104, an upper electrode 105, the protective layer 106, an intermediate layer 107, and an organic resin 109.

In FIG. 2, the lower electrodes 102 are formed on the substrate 101, and the insulating films 103a and 103b are formed so as to cover each end of the lower electrodes 102. In portions in which the insulating films are not formed and the lower electrodes are exposed, the organic compound layer 104 is stacked on the lower electrodes 102. Further, on the organic compound layer 104, the upper electrode 105 is stacked. In this state, when a current is caused to flow between the lower electrode 102 and the upper electrode 105, only the portions in which the lower electrodes 102 are exposed emit light. The portions correspond to organic EL light emitting portions. The light emitting region indicates an entire region having a plurality of organic EL light emitting portions including a region between the organic EL light emitting portions adjacent to each other, and corresponds to a region I divided by the dotted line of FIG. 2. Peripheral portions of the light emitting region do not emit light, but when the portions in which the insulating film is not formed and the member of the substrate is exposed similarly to the organic EL light emitting portions, that is, so-called dummy pixels are disposed, the light emitting region contains the portions. Further, the outside the light emitting region indicates a region which is outside the light emitting region, and corresponds to a region O shown in FIG. 2.

Further, the protective film 106 is formed over the entire area of the organic EL device array, and the protective film 106 and the member 108 that are disposed on the substrate 101 are bonded to each other through the intermediate layer 107. Each end of the member 108 and the intermediate layer 107 is covered with the organic resin 109.

According to the present invention, the thinnest portion of the intermediate layer 107 is present outside the light emitting region (region O). More specifically, the thinnest portion of the intermediate layer 107 is provided on the insulating film 103b. As a result, water or the like which enters the intermediate layer 107 is blocked off by the thinnest portion of the intermediate layer 107, thereby preventing the water or the like from entering the light emitting region (region I). Thus, the amount of water or the like which enters the light emitting region can be reduced, and the damage on the organic compound layer 104 due to the water or the like can be reduced, whereby light emission can be maintained for a longer period of time. In FIG. 2, the thinnest thickness is represented by $d_{min}$. The thickness $d_{min}$ is preferably 1 μm or more to 50 μm or less. This is because, when the thickness $d_{min}$ is less than 1 μm (lower limit), it is difficult to provide the intermediate layer 107 over the entire light emitting region in the manufacturing process, and foam may be mixed therein. In addition, the member 108 and the protective layer 106 are deformed due to thermal expansion or the like to be brought into contact with each other, which may damage the protective layer 106. On the other hand, when the thickness $d_{min}$ is more than 50 μm (upper limit), the passage through which water or the like enters is made wider, so there is a possibility that the amount of the water or the like which enters the light emitting region cannot adequately be reduced.

Further, according to the present invention, the length of the organic EL device array in an in-plane direction in the portion in which the thickness of the intermediate layer 107 becomes thinnest outside the light emitting region is preferably longer. This is because when the length thereof is longer, a more effect of blocking off the water can be expected. In this embodiment, the length of the insulating film 103b, which is disposed outside the light emitting region, in the in-plane direction is longer than that of the insulating film 103a disposed between the organic EL light emitting portions adjacent to each other. The length of the organic EL device array in the in-plane direction in the portion in which the thickness of the intermediate layer 107 becomes thinnest is represented by symbol W shown in FIG. 2. Note that, as an area which is outside the light emitting region becomes larger, an area of the light emitting area relatively becomes smaller, so it is necessary to suppress within the predetermined range the length of the organic EL device array in the in-plane direction in the portion in which the thickness of the intermediate layer 107 becomes thinnest. Specifically, the predetermined range is preferably 0.1 mm or more to 5 mm or less.

According to the present invention, as to the thinnest portion, it is not intended to exclude portions having the same thickness as that of the thinnest portion in the light emitting region (region I). In other words, the thinnest portion contains not only the portion, in which the portion of the intermediate layer 107 which is thinnest among all the portions of the light emitting region (region I) is present outside the light emitting region (region O), but also the portion in which the portion of the intermediate layer 107 having the thickness of $d_{min}$ is present in the light emitting region (region I). This is because, even when the portions having the same thickness as that of the thinnest portion are contained in the light emitting region (region I), the thickness $d_{min}$ is thinnest, so it is possible to obtain the same effect of blocking off water or the like. According to this embodiment, the portion in which the thickness thereof becomes thinnest is also present on the insulating film 103a contained in the light emitting region.

Further, according to this embodiment, the thickness of the intermediate layer 107 is made thinnest by disposing the organic compound layer 104, the upper electrode 105, and the protective film 106 on the insulating film 103b, but the thickness thereof may be made thinnest with another structure. For example, each thickness of the organic compound layer 104, the upper electrode 105, the protective film 106, or the insulating film 103b may be thicker than that of the other portion, or another member may be disposed on only the corresponding part. Another member is, for example, an auxiliary electrode (not shown) disposed outside the light emitting region by electrically connecting with the upper electrode 105.

Hereinafter, each component which constitutes the organic EL device array according to this embodiment will be described.

According to the present invention, each lower electrode 102 is preferably a light-reflective member, and is preferably made of a material of, for example, Cr, Al, Ag, Au, and Pt. This is because when the member having higher reflectance is used, it becomes possible to improve light extraction efficiency.

The organic compound layer 104 may have a plurality of layers. For example, the organic compound layer 104 may be 3 layers composed of a hole transporting layer, a light emitting layer, and an electron transporting layer, and may be 5 layers composed of a hole injecting layer, a hole transporting layer, a light emitting layer, an electron transporting layer, and an electron injecting layer.

Each upper electrode 105 is preferably a light transmissive member, and is preferably made of a transparent conductive material of, for example, ITO and IZO. Alternatively, for the upper electrode 105, a semi-light transmissive reflective member may be used. In this case, the semi-light transmissive reflective member is preferably a metal film having a thickness of about 1 nm to 60 nm.

According to the present invention, as to a light extracting direction, light may be extracted from either the side of the lower electrode 102 or the side of the upper electrode 105. In the case where light is extracted from the side of the lower electrode 102, the lower electrode 102 is preferably formed of a light transmissive member unlike the above description, and the upper electrode 105 is preferably a light-reflective member.

The protective film 106 is preferably formed of a member, such as a silicon nitride film, having a high moisture-proof property. Further, when light is extracted from the side of the protective film 106, the protective film 106 is preferably formed of a member which hardly absorbs light.

The intermediate layer 107 is preferably formed of a member having low viscosity. Further, when light is extracted from the side of the intermediate layer 107, the intermediate layer 107 is preferably formed of a member having a refractive index which is between a refractive index of the protective film 106 and that of the glass plate 108 and having high transparency. For example, an adhesive material such as an acrylate resin may be used.

The member 108 is preferably a member having a high moisture-proof property or having crashproof, and is preferably, for example, glass. In addition, the member 108 may be an optical member such as a circularly polarizing plate. In a case where such optical member is disposed, it is possible to improve a function of reducing reflection of external light or a function of improving the light extraction efficiency.

The organic resin 109 may be an adhesive of a thermosetting type, a room-temperature-setting type, or a photo-setting type. In this case, the organic resin 109 is preferably, for example, an acrylate resin or an epoxy resin.

According to the present invention, each end of the member 108 and the intermediate layer 107 is preferably covered with the organic resin 109. By covering each end of the member 108 and the intermediate layer 107, it is possible to prevent a panel frame from increasing beyond necessity. In addition, by providing the protective layer 106, the member 108, and the organic resin 109, it is possible to reduce the amount of the water or the like which enters intermediate layer 107 from the outside.

Second Embodiment

Figure 3:
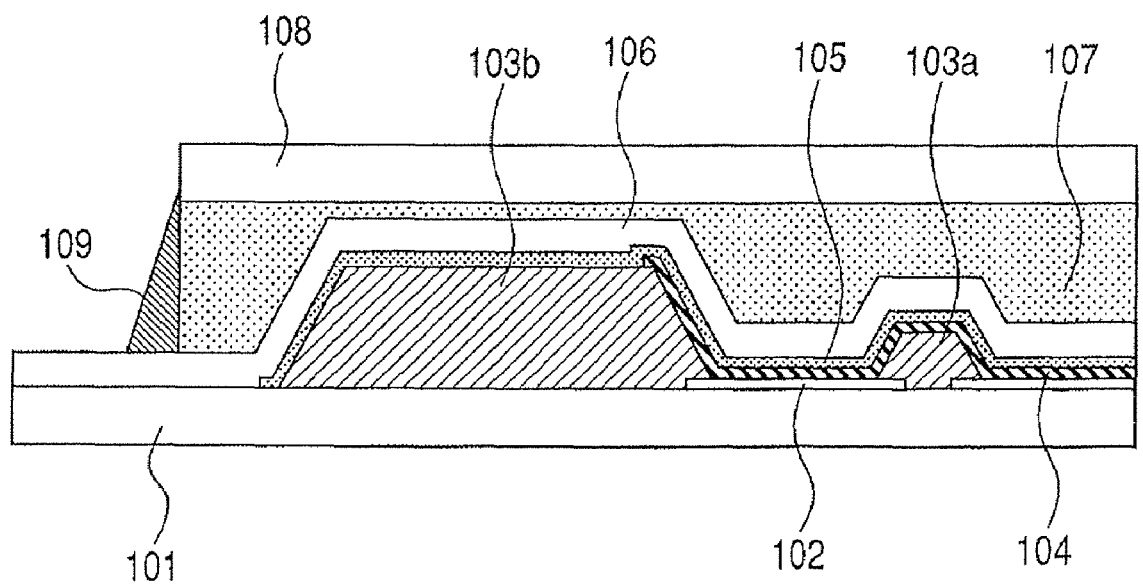
FIG. 3 is a cross-sectional schematic view of a structure taken along the line 2-2 of FIG. 1 of an organic EL device array according to a second embodiment of the present invention.

FIG. 3 is a cross-sectional schematic view of a structure taken along the line 2-2 of FIG. 1 of an organic EL device array according to a second embodiment of the present invention. Components of FIG. 3 identical with those of FIG. 2 are denoted by the same reference symbols.

According to this embodiment, the thickness of the insulating film 103b is thick, making the thickness of the intermediate layer 107 is thinnest outside the light emitting region. With the structure, it is also possible to prevent water or the like, which has enters the intermediate layer 107 from the outside, from entering the light emitting region.

The thickness of the insulating film 103b is thicker than that of the insulating film 103a disposed between the organic EL light emitting portions adjacent to each other. As a result, the thickness of the intermediate layer 107 becomes thinnest on the insulating film 103b disposed outside the light emitting region, making it possible to reduce the amount of the water or the like which entering the light emitting region.

The organic compound layer 104 may be stacked on a part of the insulating film 103b as shown in FIG. 3, or may be stacked so as to cover the entire insulating layer 103b.

Third Embodiment

Figure 4:
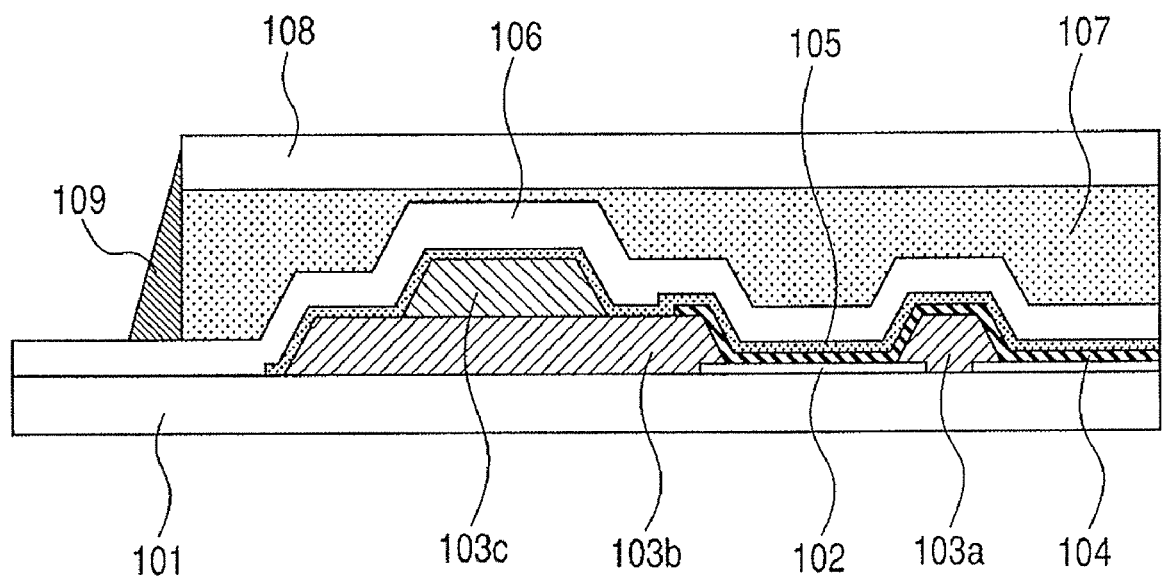
FIG. 4 is a cross-sectional schematic view of a structure taken along the line 2-2 of FIG. 1 of an organic EL device array according to a third embodiment of the present invention.

FIG. 4 is a cross-sectional schematic view of a structure taken along the line 2-2 of FIG. 1 of an organic EL device array according to a third embodiment of the present invention. Components of FIG. 4 identical with those of FIG. 2 or 3 are denoted by the same reference symbols. Reference symbol 103c denotes a second insulating film.

According to this embodiment, the second insulating film is disposed on the insulating film 103b disposed outside the light emitting region. By disposing the second insulating film 103c, the thickness of the intermediate layer 107 is made thinner.

In FIG. 4, the upper electrode 105 is disposed on the second insulating film 103c, but the upper electrode 105 may not be disposed thereon. In addition, in FIG. 4, the organic compound layer 104 is not disposed on the second insulating film 103c, but the organic compound layer 104 may be disposed thereon.

Further, the material of the insulating film 103b disposed outside the light emitting region and the material of the second insulating film 103c may be different from each other, or may be the same. When those materials are the same, it is possible to simplify a film forming process.

With the structure described above, it is also possible to obtain the structure in which water or the like hardly enters the intermediate layer 107 from the outside. Even if the water or the like enters the intermediate layer 107 from the outside, the second insulating film 103c is disposed outside the light emitting region, and the thickness of the intermediate layer 107 is made thinnest, thereby making it possible to prevent the water or the like from entering the light emitting region.

Fourth Embodiment

Figure 5:
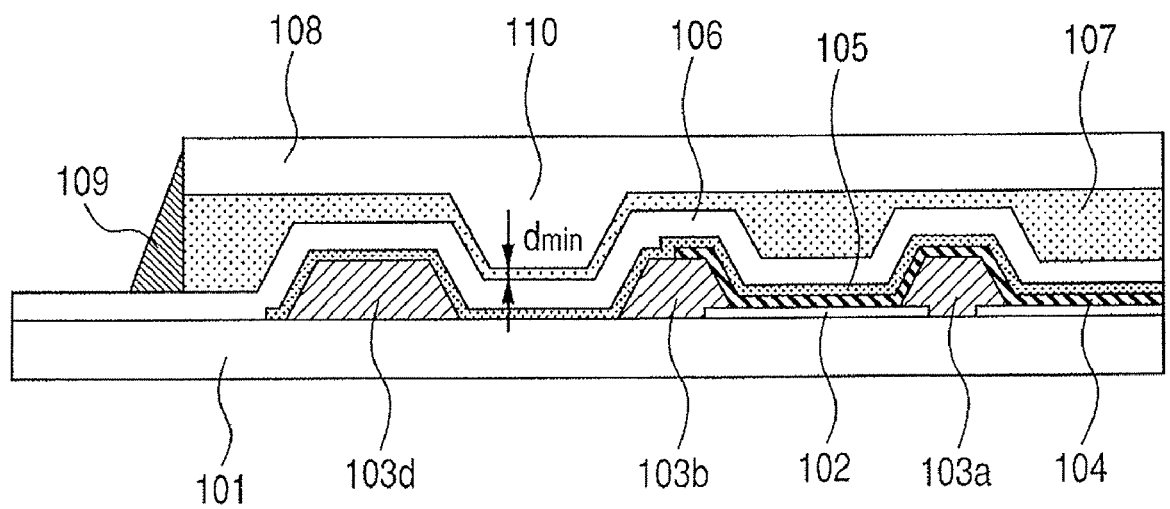
FIG. 5 is a cross-sectional schematic view of a structure taken along the line 2-2 of FIG. 1 of an organic EL device array according to a fourth embodiment of the present invention.
Figure 6:
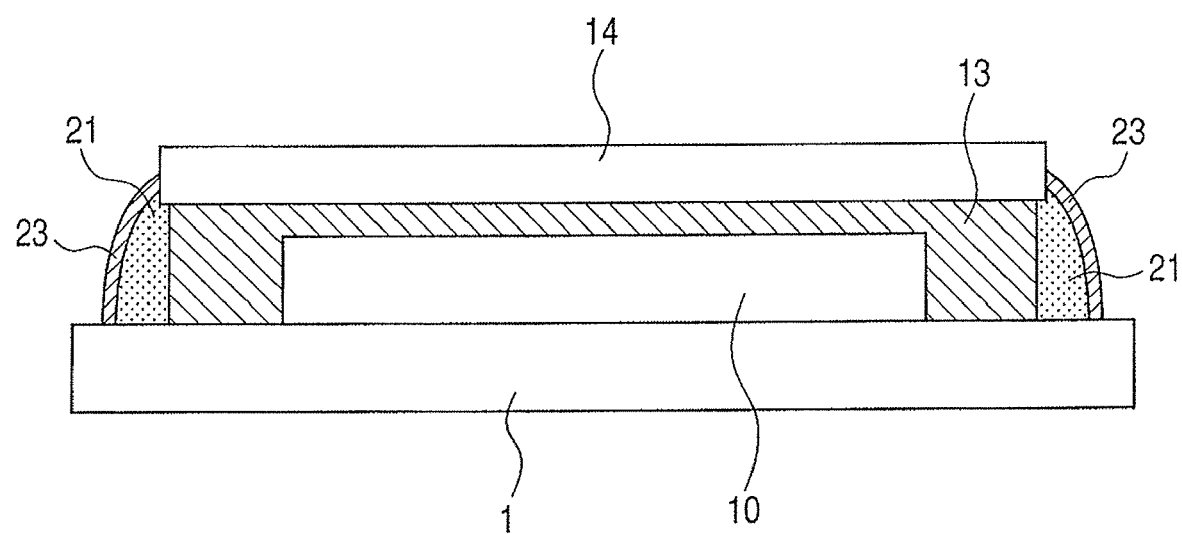
FIG. 6 is a cross-sectional schematic view of a display device described as the background art.

FIG. 5 is a cross-sectional schematic view of a structure taken along the line 2-2 of FIG. 1 of an organic EL device array according to a fourth embodiment of the present invention. Components of FIG. 5 identical with those of FIG. 2, 3, or 4 are denoted by the same reference symbols. Reference symbol 103d denotes a third insulating film disposed outside the insulating film 103b which is disposed outside the light emitting region, and reference numeral 110 denotes a protruding portion provided to the member 108.

According to this embodiment, the member 108 disposed on the protective layer 106 includes the protruding portion 110 on the side of the intermediate layer 107, and the protruding portion 110 is disposed between the insulating film 103b which is disposed outside the light emitting region and the third insulating film 103d. In other words, the thickness of the intermediate layer 107 is thinnest between the protruding portion 110 and the protective layer 106.

With the structure described above, it is also possible to obtain the structure in which water or the like hardly entering the light emitting region from the outside.

Further, in the structure, the length of the portion in which the thickness of the intermediate layer is thinnest becomes longer, so a length at which the water or the like can be blocked off also becomes longer. As a result, the amount of the water or the like which enters the organic EL device is reduced, thereby making it possible to prolong the life of the organic EL device.

The sealing member 108 having the protruding portion 110 can be formed by etching a flat glass substrate.

The protruding portion 110 may not be disposed between the insulating film 103b and the third insulating film 103d, and the protruding portion 110 may be disposed on either the insulating film 103b or the third insulating film 103d. In addition, the protruding portion 110 may be disposed on the outside the third insulating film 103d.

EXAMPLE

A process of producing the organic EL device array according to the present invention includes a process of forming an organic EL layer and a process of forming a multi-layered sealing structure.

(Formation of Lower Electrode)

On a glass substrate, a Cr target was subjected to a DC sputtering, and a Cr film was formed with a thickness of 100 nm. After that, by a photo-etching method, each lower electrode was formed on a position corresponding to each of the light emitting portions.

(Formation of Insulating Layer)

Next, by a spin-coating method, a photosensitive organic resin material of a positive resist type was applied thereto with a thickness of 1 μm, pre-bake was performed, and then a portion which corresponds to each light emitting portion provided on a Cr electrode and an outer peripheral portion of the light emitting region were exposed using a photomask. After that, exposed portions were removed using a developer and post-bake was performed at a temperature of 230° C. to cure the resin.

At this time, an opening portion corresponding to each light emitting portion was formed on the Cr electrode and an insulating layer having a predetermined width was formed between the light emitting portions. The insulating films are formed such that the length of the insulating film, which is disposed outside the light emitting region, in the in-plane direction becomes longer than that of the insulating film which is disposed between the organic EL light emitting portions adjacent to each other (see FIG. 2). In addition, the insulating film disposed outside the light emitting region is preferably formed to have a height that is highest within the surface of the organic EL device array (see FIG. 3).

(Pre-treatment)

Next, the substrate was subjected to ultrasonic cleaning sequentially with acetone and isopropyl alcohol (IPA), and then the substrate was subjected to boiling cleaning with the IPA and was dried. In addition, the substrate was subjected to UV/ozone washing.

The substrate was moved into an organic EL vapor deposition apparatus to be evacuated, and an RF power of 50 W was inputted to a ring electrode provided in the vicinity of the substrate to perform oxygen plasma cleaning in a pre-treating chamber. Oxygen pressure was 0.6 Pa, and time for the pre-treatment was 40 seconds.

(Formation of Hole Transporting Layer)

The substrate was moved into a film-forming chamber from the pre-treating chamber, the film-forming chamber was exhausted to a pressure of $1 \times 10^{-4}$ Pa, and then αNPD having a hole transporting property was formed at a deposition rate of 0.2 to 0.3 nm/sec by a resistance heating vapor deposition method, to thereby form a hole transporting layer with a thickness of 35 nm. The hole transporting layer, the light emitting layer, and the electron injecting layer were deposited to a predetermined portion by using the same deposition mask. The predetermined portion corresponds to a portion in which Cr is exposed on the substrate.

(Formation of Light Emitting Layer)

Subsequently, Alq3 which is an alkylate complex was formed on the hole transporting layer with a thickness of 15 nm by the resistance heating vapor deposition method under the same condition as that of the hole transporting layer, to thereby form a light emitting layer.

(Formation of Electron Injecting Electrode Layer)

Next, Alq3 and cesium carbonate ($Cs_3CO_3$) were formed on the light emitting layer by the resistance heating co-vapor deposition method by adjusting the deposition speed thereof so that the Alq3 and cesium carbonate ($Cs_3CO_3$) were mixed at a deposition ratio of 9:1, to thereby form an electron injecting layer with a thickness of 35 nm. Specifically, the material set in each deposition boat was vaporized by the resistance heating vapor deposition method, to thereby form an organic layer at the deposition rate of 5 nm/sec.

(Formation of Upper Electrode)

Finally, the substrate was moved into another film-forming chamber, and the Cr pixel electrode was covered with mask deposited to be 130 nm in thickness by a DC magnetron sputtering method using an ITO target on the electron injecting layer, to thereby form an upper electrode. As described above, on the rear surface of the ITO target, a magnet having a strong magnetic field is arranged, thereby making it possible to perform low-voltage sputtering.

As deposition conditions, employing a room-temperature deposition without heating the substrate, a deposition pressure was set to 1.0, Pa, Ar, $H_2O$, and $O_2$ gas were used at flow rates of 500 sccm, 1.5 sccm, and 5.0 sccm, respectively, and an input power to be applied to the ITO target was 500 W, to thereby form the upper electrode. The upper electrode had a transmittance of 85% (at the wavelength of 450 nm), and a specific resistance value of $8.0 \times 10^{-4}$ Ωcm.

As described above, the lower electrode, the insulating layer, the hole transporting layer, the light emitting layer, the electron injecting electrode layer, and the upper electrode are provided on the substrate to form the organic EL layer.

(Formation of Protective Layer)

Next, after the ITO film was formed, a protective film was formed. A chemical vapor deposition (CVD) apparatus was used to stack and form a silicon nitride film on the substrate with a thickness of 3 μm. For the protective film, a film having a high moisture-proof property is preferable, and an inorganic material such as silicon nitride or oxidation silicon nitride is preferable.

(Sealing Process)

Next, an intermediate layer was formed in a sealing member such as glass. The intermediate layer is preferably formed of a viscous body having low viscosity, having a refractive index which is between a refractive index of the protective film and that of the sealing substrate, and having transparency. For example, an adhesive made of an acrylate resin may be used.

Next, the sealing member, which constituted the intermediate layer, was bonded in vacuum, to the glass substrate on the organic EL device array side which was covered with the protective film, and then the process proceeded to the sealing process in which the outer peripheral portion of the sealing member was sealed by the sealing member.

For the sealing member, used was an adhesive of a thermosetting type, a room-temperature-setting type, or a photo-setting type. As materials for the sealing member, an acrylate resin, epoxy resin, or the like may be used.

In the organic EL device array thus obtained, the thinnest portion of the intermediate layer was present outside the light emitting region within the surface of the organic EL device array. As a result, the passage through which water or the like enters could be narrowed, and the water or the like hardly entered the light emitting region, thereby making it possible to prolong the life of the organic EL device array.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-031045, filed Feb. 8, 2006, which is hereby incorporated by reference herein in its entirety.

What is claimed is:

1. An organic EL device array, which includes within a surface thereof a light emitting region having a plurality of organic EL light emitting portions for emitting light in an organic compound layer disposed between a pair of electrodes, comprising:
    (a) a protective layer in contact with an upper electrode of the pair of electrodes;
    (b) a member disposed on the protective layer;
    (c) an intermediate layer disposed between the protective layer and the member,
    wherein the intermediate layer has a thinnest portion outside the light emitting region within the surface of the organic EL device array; and
    (d) a first insulating film outside the light emitting region, wherein the intermediate layer is disposed on the insulating film; and the thinnest portion of the intermediate layer is provided on the insulating film; and
    (e) a second insulating film disposed between the organic light emitting portions adjacent to each other,
    wherein (i) the first insulating film disposed outside the light emitting region has a length in an in-plane direction of the light emitting region, which is greater than a length, in the in-plane direction, of the second insulating film disposed between the organic EL light emitting portions adjacent to each other, and (ii) the first insulating film disposed outside the light emitting region is thicker than the second insulating film disposed between the organic EL light emitting portions adjacent to each other.

2. An organic EL device array, which includes within a surface thereof a light emitting region having a plurality or organic EL light emitting portions for emitting light in an organic compound layer disposed between a pair of electrodes, comprising:
    a protective layer in contact with an upper electrode of the pair of electrodes;
    a member disposed on the protective layer; and
    an intermediate layer disposed between the protective layer and the member,
    wherein the intermediate layer has a thinnest portion outside the light emitting region within the surface of the organic EL device array, and
    wherein the member disposed on the protective layer has a protruding portion on a side of the intermediate layer; and
    the intermediate layer has the smallest thickness between the protruding portion and the protective layer.

* * * * *